United States Patent
Liu et al.

(10) Patent No.: US 7,991,023 B2
(45) Date of Patent: Aug. 2, 2011

(54) MULTI-BAND MULTIWAVELENGTH QUANTUM DOT MODE-LOCKED LASERS

(75) Inventors: Jiaren Liu, Ottawa (CA); Zhenguo Lu, Ottawa (CA); Sylvain Raymond, Ottawa (CA); Philip Poole, Ottawa (CA); Pedro Barrios, Ottawa (CA); Daniel Poitras, Ottawa (CA)

(73) Assignee: National Research Council of Canada, Ottawa, ON (CA)

( * ) Notice: Subject to any disclaimer, the term of this patent is extended or adjusted under 35 U.S.C. 154(b) by 4 days.

(21) Appl. No.: 12/585,830

(22) Filed: Sep. 25, 2009

(65) Prior Publication Data

US 2010/0142566 A1    Jun. 10, 2010

Related U.S. Application Data

(60) Provisional application No. 61/136,698, filed on Sep. 25, 2008.

(30) Foreign Application Priority Data

Jun. 25, 2009   (CA) ..................................... 2674959

(51) Int. Cl.
*H01S 3/89* (2006.01)
*H01S 3/10* (2006.01)

(52) U.S. Cl. .... 372/18; 372/23; 372/29.015; 372/44.01; 372/43.01

(58) Field of Classification Search ............. 372/29.015, 372/44.01, 43.01, 23, 18
See application file for complete search history.

(56) References Cited

U.S. PATENT DOCUMENTS

| | | | |
|---|---|---|---|
| 6,192,058 B1 * | 2/2001 | Abeles | 372/6 |
| 6,256,328 B1 * | 7/2001 | Delfyett et al. | 372/23 |
| 6,816,525 B2 * | 11/2004 | Li et al. | 372/45.01 |
| 6,870,178 B2 * | 3/2005 | Asryan et al. | 257/14 |
| 7,769,062 B2 * | 8/2010 | Lu et al. | 372/23 |
| 2006/0227825 A1 * | 10/2006 | Kovsh et al. | 372/30 |
| 2007/0189348 A1 * | 8/2007 | Kovsh et al. | 372/45.01 |
| 2008/0310470 A1 * | 12/2008 | Ooi et al. | 372/44.01 |
| 2009/0238228 A1 | 9/2009 | Lu et al. | |

* cited by examiner

*Primary Examiner* — Minsun Harvey
*Assistant Examiner* — Joshua King

(57) ABSTRACT

A multi-band (multi-color) multiwavelength mode locked laser diode is provided by dynamic phase compensation of a quantum dot active medium. The laser diode is provided with a PIN diode structure where the active medium consists of a plurality of layers of quantum dots such as those produced by self-assembly from known chemical beam epitaxy methods. The multiplicity of bands may be produced by AC Stark splitting, frequency selective attenuation, or by the inclusion of multiple different layers having different, respective, peak ASE emissions. Dispersion compensation within laser facets, waveguides, and the optically active media permit the selection of a fixed dispersion within the cavity. A dynamic group phase change induced by the AC Stark effect permits compensation of the fixed dispersion sufficiently to produce an intraband mode-locked laser. Even interband mode locking was observed.

17 Claims, 5 Drawing Sheets

US 7,991,023 B2

MULTI-BAND MULTIWAVELENGTH QUANTUM DOT MODE-LOCKED LASERS

CROSS-REFERENCE TO RELATED APPLICATIONS

This application claims the benefit of U.S. Provisional patent application Ser. No. 61/136,698 filed Sep. 25, 2008; and Canadian Formal Application 2,674,959 filed Jun. 25, 2009 the entire contents of which is herein incorporated by reference.

FIELD OF THE INVENTION

This invention relates in general to optical laser sources such as may be used in telecommunications, optical networking systems, sensing, metrology, instrumentation, spectroscopy, imaging, laser machining, and RF/THz generators. More particularly the invention relates to the use of nonlinear effects of quantum dot active media to produce two or more multiwavelength bands that are intraband mode locked, or even mutually (interband) mode locked.

BACKGROUND OF THE INVENTION

Multiwavelength lasers based on Quantum Dots (QDs) are known in the art. They produce light that, in the frequency domain, consists of a few to hundreds of lasing modes that are discretely and substantially uniformly spaced apart in a band (also known as a "colour").

According to the prior art, (single-band) multiwavelength lasers have been produced with different gain materials such as rare-earth-doped fibers, bulk or quantum-well (QW) semiconductor waveguides, and by using different techniques such as active overlapping linear cavities [5], a high birefringence fiber loop mirror [6], intracavity polarization hole burning [7], distributed Bragg grating [8], an elliptical fiber [9], intracavity tunable cascaded long-period fiber gratings [10], a sampled chirp fiber Bragg grating [11], a self-seeded Fabry-Pérot laser diode [12], spatial mode beating within a multimode fiber section [13], multi-cavity oscillation [14], and others [15-18].

Because of the nature of large homogeneous broadening of gain media, the resulting multiwavelength lasers are sensitive to variations in intracavity gain and/or loss. Because every lasing mode shares mostly the same population inversion reservoir, all lasing modes compete continuously with each other for a larger share of this reservoir. Given the unavoidable fluctuations in electrical and optical fields within the optically active medium, the intracavity gain-loss balance for any lasing mode could be broken, resulting in fluctuations of the laser output. Consequently, the number of lasing modes in one band is very limited and the intensity of each lasing mode fluctuates.

To overcome these problems, a new gain material, semiconductor quantum dots (QDs), were introduced for generating multiwavelength lasers. The nature of QDs as active gain material permits inhomogeneous gain broadening to suppress the competition among lasing modes, leading to single-band QD-based multiwavelength lasers with tens or hundreds of lasing modes [2-3, 19], which have been demonstrated with high intensity stability and high signal-to-noise ratio.

So far, QD-based mode-locked lasers at different wavelengths and various repetition rates have been successfully demonstrated [24-26] owing to the inhomogeneous spectral broadening based on the statistical distribution in QD sizes and shapes as well as the subpicosecond gain recovery times.

Because of their compact size, mechanical stability, low power consumption, direct electrical pumping, easy operation, and manufacturability, (single-color) mode-locked lasers are promising as cost-effective and versatile light sources for many applications such as: all-optical clock recovery and high bit rate transmission in optical communications [20], coherent manipulations of qubits in quantum computation [21], generation of microwave or THz radiation in spectroscopy [22], ultrafast optical processing, multi-photon imaging, and laser machining [23]. These and other applications are possible for multi-band mode-locked lasers.

Multi-band (or multi-colour) lasers, lasers that emit at multiple bands are also known. Mode-locked lasers operating simultaneously at two or more bands have been developed in the visible wavelength range with the use of two cavities sharing a single Ti: sapphire crystal [27], or by Raman scattering [28-29]. However, as far as Applicant knows, no work specially addressing two- or multi-band mode-locked lasers using QD active media has been reported.

Recently two-band QD-based multiwavelength continuous wave (CW) lasing from both a ground state and an excited state has been reported [4] near the 1.3 μm wavelength neighbourhood. Because the ground state and excited state have fixed energy-level structures, the band positions in this two-band laser are also fixed. This provides no flexibility in the positions and distributions of the bands.

There is a need for multi-band multiwavelength lasers from QD materials with some flexibility regarding the positions and distributions of the channels within the bands. Furthermore it would be desirable to produce intraband, and/or multiwavelength mode-locked lasers.

SUMMARY OF THE INVENTION

Applicant has discovered that it is possible to produce intraband mode locked dual band multiwavelength lasers based on quantum dot (QD) active medium, and has even demonstrated interband mode locking. The use of AC Stark splitting to achieve both the splitting of the output into two bands, and to provide a dynamic phase change that effectively compensates for static dispersion is demonstrated. In effect, the mode locking is provided by supplying a pump current to a PIN diode (having the QD active medium) so that a dynamic phase change is produced that compensates for the static dispersion sufficiently to produce the mode locking.

Accordingly a QD PIN diode laser is provided that has: a p doped cladding and an n doped cladding at opposite faces of an active medium, the active medium consisting essentially of layers of a waveguide material between at least one layer of semiconductor quantum dots having an inhomogeneously broadened gain curve; cavity interfaces including an output coupler where a laser output is emitted, for producing a cavity enclosing the active medium, the cavity having a given cavity loss function, a fixed dispersion, and an amplified spontaneous emission (ASE) spectrum; and an electrical power supply connected to the claddings for supplying current through the active medium, the current chosen to produce a dynamic group phase change so that within each of at least two wavelength regions where the cavity loss function is majorized by the ASE spectrum, an effective dispersion is substantially constant. Multi-band multiwavelength laser emission is produced by the laser diode through the output coupler such that within each band the multiwavelength channels are mode locked.

Furthermore, a method is provided for providing a mode-locked multi-band multiwavelength laser output. The method involves: providing a pin diode laser having p and n doped claddings at opposite large faces of an active medium, the active medium consisting essentially of layers of a waveguide material between at least one layer of semiconductor quantum dots having a inhomogeneously broadened gain curve, and cavity interfaces, including an output coupler for controlling transmitted and reflected light, that produce a cavity encompassing the active medium, the cavity having a given cavity loss function, a fixed dispersion, and an Amplified Spontaneous Emission (ASE) spectrum; and supplying electrical pump current through the active medium via the claddings, the current chosen to produce a dynamic group phase change so that within each of the at least two wavelength regions where the cavity loss function is majorized by the ASE spectrum, an effective dispersion is substantially constant.

The at least two multiwavelength regions may be produced by one or more of AC Stark splitting of the gain curve, inclusion of different quantum dot layers having different properties in the active medium, and selective attenuation of the gain curve.

Supplying the pump current to produce a dynamic group phase change so that within the at least two wavelength regions the effective dispersion is substantially constant, may involve choosing the dynamic group phase change $\psi$ given by:

$$\psi = \arctan\left\{ \frac{p}{p_{th}} \gamma_{ab} \Delta \bigg/ \left[ \Delta^2 + \Omega^2 - \left(\frac{p}{p_{th}} - 1\right)\gamma_{ab}^2 \right] \right\}$$

where, $P/P_{th}$ is a pump factor, $\gamma_{ab}$ is the dipole moment decay rate of the quantum dots, $\Delta$ is a detune frequency, and $\Omega^2$ is a quantity directly proportional to lasing intensity.

The cladding may be composed essentially of InP, the semiconductor quantum dots may be composed essentially of InAs, and the waveguide layers may be composed essentially of quaternary $In_{0.816}Ga_{0.392}As_{0.392}P_{0.608}$. The semiconductor quantum dots may have densities on the order of $10^{10}$ cm$^2$; and the cladding and active medium may be arranged in a ridge-waveguide Fabry-Pérot cavity configuration having a cavity length in the neighbourhood of 0.5 mm, and a cavity width of 1-5 µm.

Furthermore a quantum dot PIN diode laser is provided, that comprises a p doped cladding and an n doped cladding at opposite large faces of an active medium, the active medium consisting essentially of layers of a waveguide material between at least one layer of semiconductor quantum dots having an inhomogeneously broadened gain curve; cavity interfaces, including an output coupler for controlling transmitted light from the cavity, for producing a cavity including the active medium, the cavity having a given cavity loss function, a fixed dispersion, and an Amplified Spontaneous Emission (ASE) spectrum; and an electrical power supply connected to the claddings for supplying current through the active medium above an AC Stark splitting threshold, where splitting of energy levels in the quantum dots yields a laser output spectrum having a pair of bands substantially symmetrically disposed about a peak of the ASE spectrum.

The fixed dispersion may be substantially constant and the current supplied through the active medium may provide a dynamic group phase change so that within at least one of the bands an effective dispersion is substantially constant, and consequently the laser output is mode locked. In some embodiments, over a tunable range of separations of the bands, the effective dispersion is substantially constant within the at least one of the bands.

Further features of the invention will be described or will become apparent in the course of the following detailed description.

BRIEF DESCRIPTION OF THE DRAWINGS

In order that the invention may be more clearly understood, embodiments thereof will now be described in detail by way of example, with reference to the accompanying drawings, in which:

FIG. 6b shows an ASE spectrum of the diode laser used to generate the laser outputs shown in FIG. 6a;

DESCRIPTION OF PREFERRED EMBODIMENTS

Figure 1:
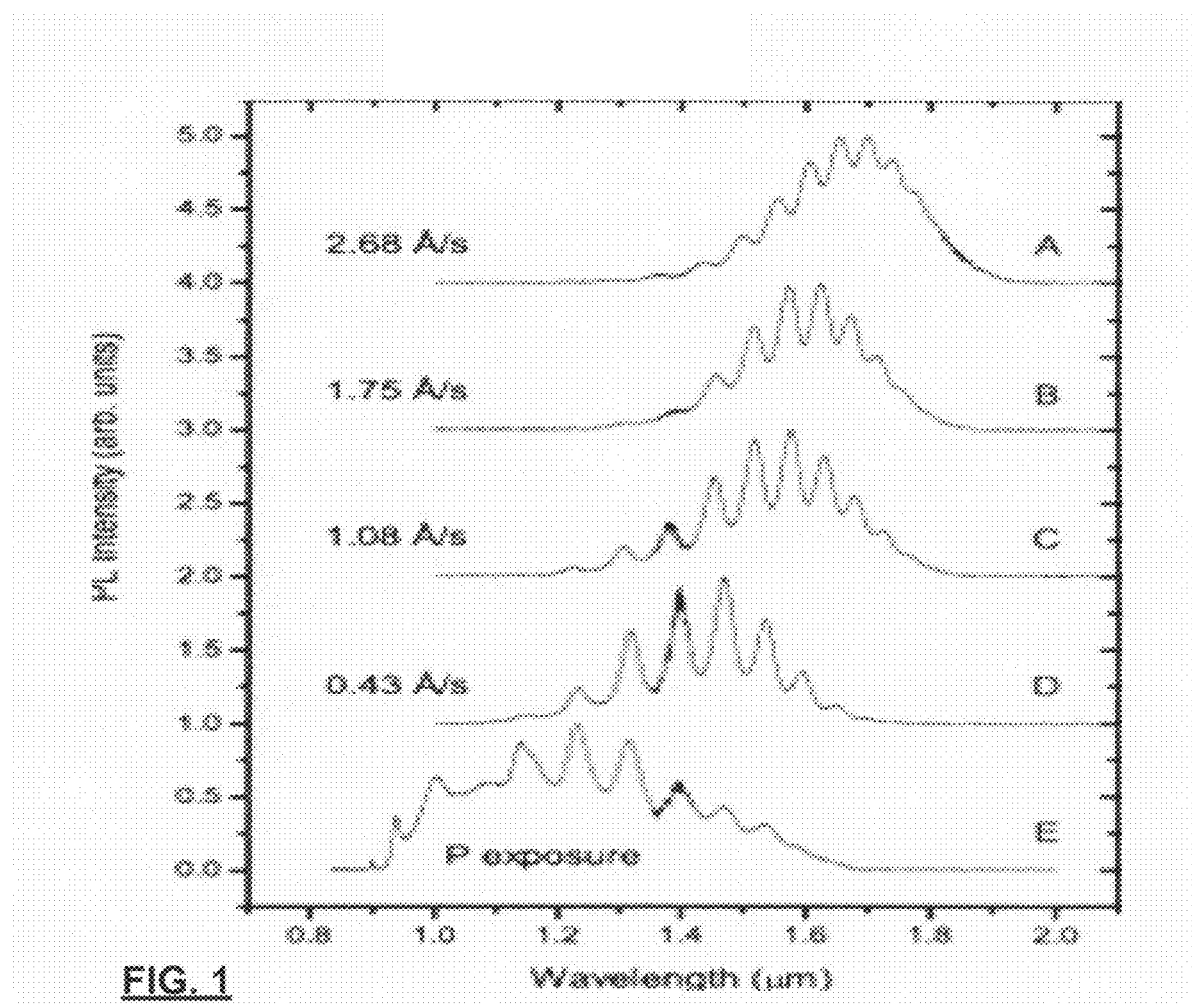
FIG. 1 is a graphical representation of a variety of gain curves that can be obtained using a same production method, by simply varying a heath of the QDs.

Mode locked laser diodes are provided herein, as are methods of producing a mode locked multi-band multiwavelength laser output. In accordance with the invention, multi-band multiwavelength laser diodes are provided in the form of a pin diode with a quantum dot (QD) active medium wherein a dynamic dispersion that varies with operating conditions of the laser is controlled to correct a fixed dispersion of the laser, at least across two wavelength regions where the cavity loss function is majorized by gain curve of the laser. This results in (intraband) mode locking of the channels within each of the wavelength regions.

PIN Diode Structure

More specifically, in accordance with the invention, a laser diode is provided that includes an active medium that includes at least one layer of QDs embedded in an optical waveguide, so that the QDs are spatially isolated from one another in 3 dimensions. The active medium is enclosed by a cavity interface, which includes a facet for selectively transmitting laser output and reflecting light back into the cavity.

In general, the more QD layers, and the higher the QD density of the layers, the more optical power is produced by a given pump current as there are effectively more emitters. At the same time it is increasingly difficult to produce higher and higher stacks of QD layers using the presently preferred methods, such as epitaxial growth and self-assembly. Accordingly a preferable number of layers of QDs is at least two layers or three layers. With current methods less than 30, or 15 layers, more preferably less than 12 or 10 layers are generally preferable. Specifically 5 layers are shown to work well.

The optical waveguide and QDs are formed of semiconductors. The selection of fabrication methods (chemical vapour deposition, chemical beam epitaxy, etc.) and compounds are known and it is within the scope of the person of ordinary skill in the art to do so. Chemical beam epitaxy is preferred because it provides for integration with semiconductors in a straightforward manner. In the illustrated embodiments, the wetting layers are InGaAsP, the QD layers are formed of InAs layers, and the active medium/waveguide is clad in InP. While the QDs used in the verification of the invention are formed of InAs, it will be appreciated that other QDs such as GaAs, InGaAs, CdSe, and GaN could be used alternatively.

The QDs have a distribution of sizes and geometries, such as provided by self-assembly to provide inhomogeneous gain broadening. The QDs used in the demonstration of the invention were produced by depositing a continuous layer using chemical beam epitaxy, followed by strain release to crack the layer to form the QDs by self assembly, and then a resurfacing of the cracked layer, in a manner that is known in the art. The QDs were substantially planar sheets having dimensions in the neighbourhood of $10^{-8}$ m in two dimensions and a few nanometers in the third. It will be appreciated that QD layers having various distributions of sizes, geometries, and compositions are known by changing growth parameters, strains and thermal treatments, as well as by controlling a crystal lattice mismatch between the deposited layer and substrate.

Generally a high QD density is desirable. Applicant has found QD layer densities on the order of $10^{10}$ per $cm^2$ to be more than adequate, although different densities may be used. Lower QD densities may be possible if operation above the splitting threshold of the AC Stark effect is not used to achieve the multiple bands.

As is well known in the art, such layers of QDs produce an inhomogeneously broadened gain curve. Furthermore it is known that modification of the growth parameters (strains, substrate surface properties, thermal treatments, thicknesses, compositions, deposition rates, etc.) have known effects on the gain curves of the produced layers.

Only modes of wavelengths that have higher gain than cavity loss will lase. As cavity losses are typically functions of wavelength, it is useful to selectively attenuate (absorb or otherwise remove from the cavity) wavelength modes of the compound ASE spectrum different from those that are to lase. By attenuation of the wavelengths that are not desired for lasing, the QDs that would otherwise have been absorbed at these wavelengths become available for the lasing of the desired modes. This can be performed using a controllable variable optical attenuator, or an absorber, for example, and can be effected by controlling cavity interfaces, such as a pair of facets defining the longitudinal mode length of the cavity.

One important effect of such attenuation is that the design of the laser is not limited to a peak of the gain curve of the QD layer. By selective frequency attenuation in the neighbourhood of the peak at cavity interfaces, a different, adjacent wavelength region becomes the effective local peak. This permits the selection of $\Delta$, a difference between peak center frequencies of the laser output and gain curves.

Between the QD layers, waveguide layers are deposited. These layers are generally thicker and provide a support for the application of successive QD layers. The waveguide layers are important because they typically contribute significant dispersion as well as some absorption to the cavity.

On opposite large faces of the active medium/waveguide are means for conducting electrical current through the active medium. Oppositely doped semiconductor cladding coupled to junctions can be used. The junctions with the cladding preferably serve as cavity interfaces. Pump electricity is provided through these junctions to pump the QDs.

While the cladding provides cavity interfaces on two sides, it will be appreciated by those skilled in the art that other cavity interfaces are chosen to enhance desired (e.g. usually longitudinal) modes within the cavity, and to suppress others.

In the following examples, the configurations of the PIN diode lasers are assumed to be ridge-type waveguides. It will be appreciated that other configurations are possible, such as quadrupolar designs, and any other geometric layout can alternatively be used.

The operational current of the laser is chosen simultaneously to supply enough pump energy so that the gain curve exceeds cavity loss over two or more (lasing) wavelength regions (lasing bands), and to produce a dynamic dispersion that results in a substantially constant dispersion within at least two lasing bands.

Multi-Band Lasing Methods
Multiple Gain Curves

As the active medium may contain a number of layers of QDs, and as different kinds of QDs are known to exhibit different gain curves, one way that multiple bands can be achieved is to use two (or more) kinds of layers, where the different kinds of layers are produced using different protocols to achieve different peak gains. By including multiple layers of the QDs of different kinds, multiple bands above the lasing threshold can be achieved. Cavities containing these layers exhibit compound ASE spectra with peaks at multiple wavelengths. It is this compound ASE spectrum that starts the lasing process of the material. Selection of the layers therefore permits the selection of different wavelength regions of the peaks.

A compound gain curve can be chosen by multiplexing of QD of various sizes and geometries. If the active medium includes $N_i$ layers of QDs, for i=1, ..., m<15, the compound gain curve of the active medium would be the linear superposition of the m gain curves. If each layer of QDs and has a gain curve with a respective lasing band, m-band multiwavelength lasers would be produced. For example, a dual band ASE spectrum was reported in [34] using two different-sized QD families, and 5 multi-band ASE spectra of QD layers having different heights resulting in shifted bands were published by Applicant in [35]. The contents of [34] and [35] are incorporated herein by reference. FIG. 1 reproduces an image from this reference showing that it is possible to produce multi-band multiwavelength photoluminescent stacked QD structures. The foregoing 2 examples are not exhaustive of the variety of possible combinations of QD layers that can be assembled to form active media.

Figure 2:
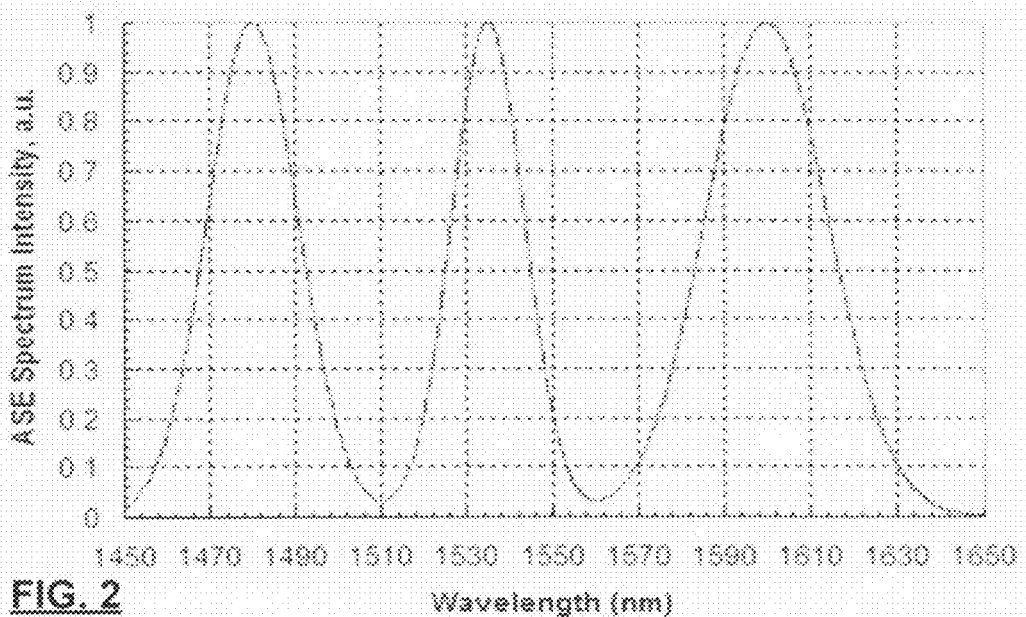
FIG. 2 is a graph of ASE spectra that might be produced by multiplexing layers of QDs having different sizes and geometries.

Synthesizing and/or stitching the gain curves of each band with the proved technologies in [34-35], produces compound gain curves having a variety of shapes, including multi-peaked gain curves having desired amplitudes. Generally peaks that result in output spectra with equal amplitudes are desired. Accordingly, desired band peak amplitudes could be chosen to compensate for frequency variance of cavity loss. Furthermore, as the higher frequency bands in the frequency domain may re-pump the lower frequency bands, leading to the quenching of the higher frequency bands in use, a further reduction in the lower frequency bands and increase in higher frequency bands may be called for. By selecting the layer numbers $N_i$ and the ASE spectra for all layers, a gain curve with multiple and equal bands as shown in FIG. 2 can be created.

While the combinations of QD layers are preferably stacked to minimize a number of electrodes, it will be appreciated that other arrangements are possible, including side-by-side arrangements, where optical waveguide continuity is provided for.

Attenuation

Inversely, it is possible to attenuate a broad ASE spectrum at select frequencies to produce a compound ASE spectrum having multiple peaks at desired wavelength regions using known thin film techniques. For example, it is possible to attenuate by incorporating absorbers, or elements that simply corrupt the coherence (in space and/or time) of select wavelengths, or in other ways known in the art, but in accordance with a preferred embodiment, cavity interfaces are used to selectively transmit modes that are at frequencies distant the desired bands.

ASE spectra are affected by selecting cavity interfaces. If we take the cavity to have a rectangular ridge-waveguide configuration having two opposing facets at smallest faces, cladding along largest, opposing, faces, and along longitudinal high aspect ratio faces, a naked cavity interface boundary, selection of the longitudinal modes is provided with high reflectivity coatings at the facets (for near normal incidence) in comparison with high transmission along the longitudinal high aspect ratio faces. Along transverse directions of the cavity, for a typical rectangular cavity, modes are attenuated. Assuming this layout, for example, coatings serve as reflectors at respective facets, one of which, is an output coupler of the laser.

Figure 9A:
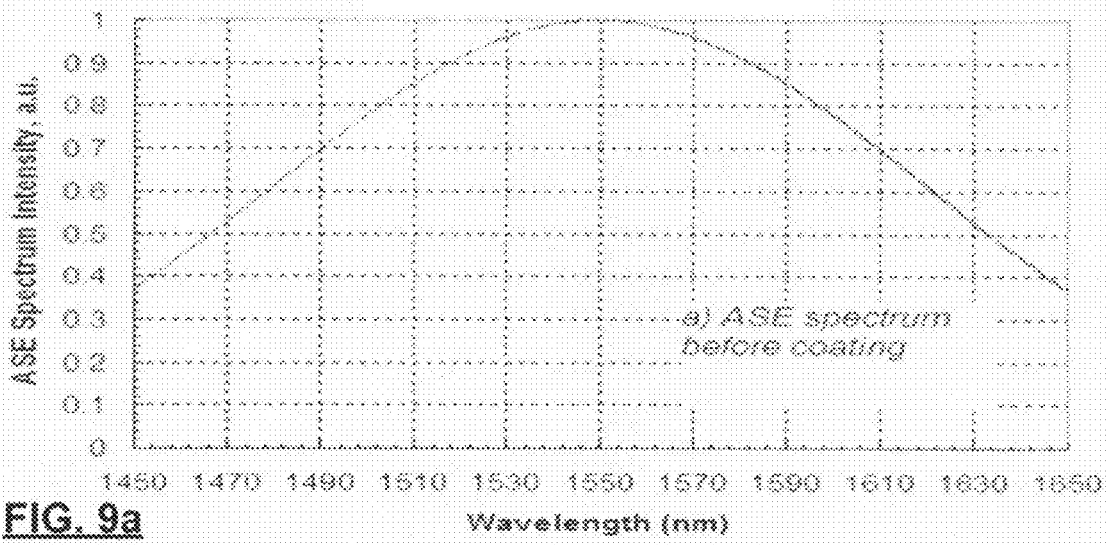
FIGS. 9a-c show how to achieve multi-band mode locking using the active medium of the previous examples, using a coating to selectively attenuate modes within the cavity.

For example, given an active medium with QD layers embedded in a semiconductor waveguide that exhibits a very broad gain curve, such as shown in FIG. 9a (described below in relation to Example 2) or in Ref. [1] the contents of which being incorporated herein by reference, it is well known in the art to select a coating for a cavity mirror or mirrors, for which one or more central bands have lower reflectivity while the side bands have higher reflectivity.

The quantitative design of band reflectivity is preferably based on ASE measurements made before coatings are added, using the cavity loss function, and cavity length, as well as the center wavelengths and shapes of the desired lasing bands.

AC Stark Splitting

According to the current understanding of lasers, lasing modes generated by electrically pumped QDs (ASE) interact again with QDs themselves inside the same cavity. The strengths of the looped interactions between QDs and self-generated lasing modes are represented by Rabi frequencies [21]. These interactions lead to spectral changes in the laser output from the gain curve and ASE spectra. For a given cavity that selects some interactions, for strong enough electrical pumping, energy level splittings of the QD ensemble would be expected to occur by amounts given by the Rabi frequencies; this phenomenon is referred to as AC Stark splitting.

Figure 3:
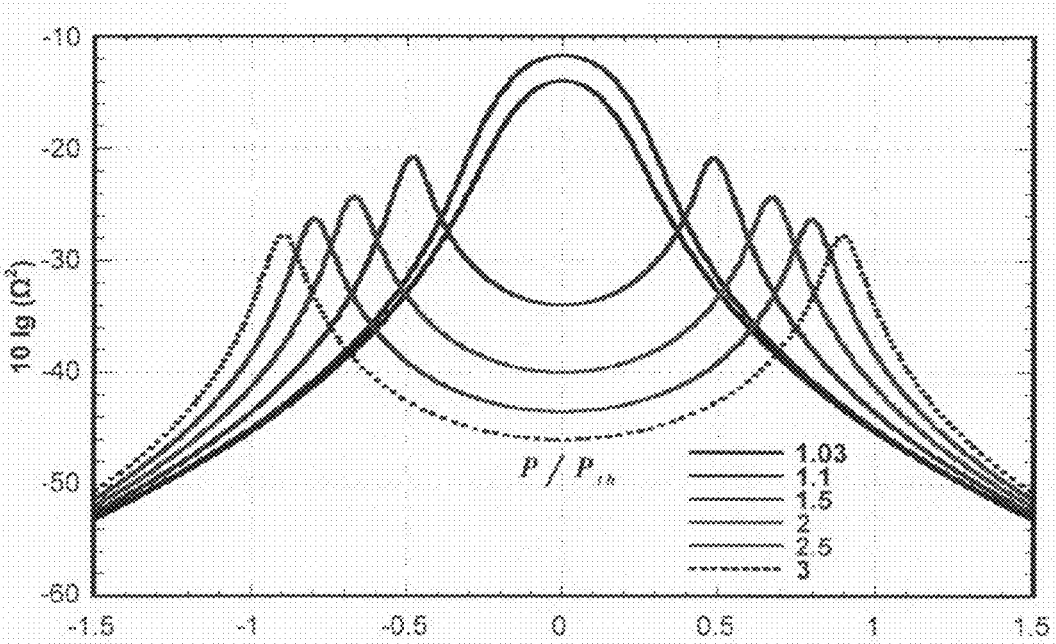
FIG. 3 is a theoretically derived plot showing the laser intensity as a function of detuning at various pump levels.

FIG. 3 is a plot showing a theoretical calculation of laser energy output ($\log_{10}(\Omega^2)$) v.s. $\Delta$ at different pumping levels $P/P_{th}$. As previously stated $\Delta$ is the detune frequency i.e. the difference between the peak of a QD gain curve and the resulting lasing frequency. $\Omega^2$ is a quantity proportional to lasing intensity. P is the electrical pump intensity (current), and $P_{th}$ is the pump intensity at the lasing threshold, respectively. This graph illustrates the AC Stark splitting. Resulting lasing spectra are dramatically modified by the AC Stark effect. For example, one-band lasing would be transferred into two-band lasing.

It should be noted that P is the only condition that is controlled dynamically, although by varying reflectance at the output coupler, $\Omega^2$ can, in principle, be independently modified. As previously stated, $\Delta$ can be modified by frequency selective attenuation, but is generally a fixed property of the PIN diode laser, as is $P_{th}$.

Our theoretical results graphed in FIG. 3 show that lasing occurs initially within a band centered at $\Delta=0$ and the number of lasing modes is determined by the bandwidth and the intracavity gain and loss over this band. As $P/P_{th}$ increases, intracavity lasing intensity becomes so strong that two-band lasing spectra are generated at a given threshold.

Accordingly three methods are proposed to produce multi-band multiwavelength PIN diode lasers. It will be appreciated that each combination of the above methods is contemplated by the Applicant.

Mode Locking

Dispersion within the cavity occurs when different modes propagate at different velocities. If the modes propagate at different velocities through a same distance, the laser output is a continuous wave. Mode locking across a multiwavelength band is achieved when the standing waves generated by the modes are of a substantially constant phase difference at an output coupler of the laser, where the modes interfere to produce output that is temporally pulsed, even if the pumping is continuous. If the modes have different propagation rates, the relative phases vary continuously, and there is no mode locking.

Along with the constraints on the waveguide material, and cavity design to provide low cavity losses, it is also desired to provide a fixed dispersion that is substantially constant, at least over desired lasing wavelength regions. The fixed dispersion is typically the sum of the waveguide dispersion, material dispersion, and mirror dispersions, though in principle any number of elements can be provided within the cavity to induce a change in dispersion. It is well known in the art how to perform chromatic dispersion compensation. A constant dispersion is desired to produce uniform mode spacings ($\Delta\nu$), i.e. the frequency differences between the modes (the multiple wavelengths) within a band. Note that the mode spacing is given by $\Delta\nu=c/[2\ Ln_g(\nu)]$ where L is the cavity length, c is the speed of light, and $n_g(\nu)$ is the group index of refraction of the cavity.

Herein "substantially constant" means that the variations in phase between pairs of the modes produces a chirping of the resulting pulse so that it is less than ½ the interval between the pulses. Mathematically, this means:

The static dispersion due to materials, waveguides and mirror coatings are not the only factors affecting cavity index $n_g(\nu)$, and its variation over lasing bands. Dynamic dispersion terms relating to the interaction of QD excitons with intracavity laser fields can significantly impact the variations of the index of refraction as a function of frequency over the lasing bands. Where total dispersion within a band is minimized, four-wave mixing (FWM) is dramatically enhanced. If lasing bands are broad enough, several or tens or hundreds of cavity modes would lase and their phases would be locked through FWM and other nonlinear processes. These phase-locked lasing modes lead initially to random intensity spikes in the time domain, and subsequently to periodic pulse train due to self-lensing caused by the optical Kerr effect, as the waveguides serve as thick hard apertures, and any injection current variation and/or temperature instability serves as a mode-locking starter.

Firstly, the group phase change of the intracavity laser field amplitude induced by the interaction between QDs and self-generated intercavity lasing modes could be formulated as $$\psi = \arctan\left\{\frac{p}{p_{th}}\gamma_{ab}\Delta \bigg/ \left[\Delta^2 + \Omega^2 - \left(\frac{p}{p_{th}}-1\right)\gamma_{ab}^2\right]\right\}$$

under some proper approximations, where $\gamma_{ab}$ is the dipole moment decay rate.

The dynamic group phase change represents a phase shift per unit time as a function of frequency. The differences between phase shifts as a function of frequency and is a comparative measure. This quantity is directly related to the dynamic dispersion. By adjusting the operation parameters such as the pump factor $P/P_{th}$ and the effective Rabi frequency $\sqrt{\Delta^2+\Omega^2}$, the group phase change $\psi(\Delta)$ could be positive or negative in some specific detuning $\Delta$ areas.

Figure 4:
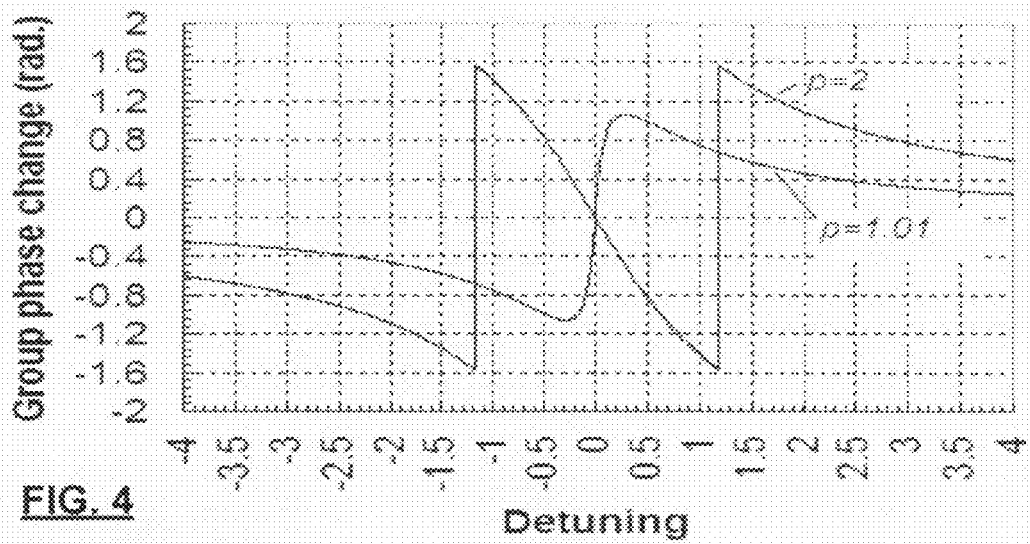
FIG. 4 is a graph plotting the group phase change $\psi(\Delta)$ versus the detuning $\Delta$ for $\Omega$=0.3 and p=1.01 and 2.

FIG. 4 is a graph showing group phase change over the cavity for a range of frequencies ($-4<\Delta<4$) for two different pump factors: $P/P_{th}=1.01, 2$. In the graph of FIG. 4, the dipole moment decay rate is taken to be a unitary constant. This is not an accurate value, and in practice it is difficult to determine this value, given that the decay rate is too fast to be captured on commonly available detection equipment. As given in the group phase change formula above, when $\Delta^2+\Omega^2 \geq (p/p_{th}-1)\gamma_{ab}^2$, $\psi(\Delta) \leq 0$ only if $\Delta \leq 0$. Thus for $P/P_{th}=1.01$ as shown in FIG. 4, the group phase change is negative for $\Delta<0$, positive for $\Delta>0$, and 0 only at $\Delta=0$. In contrast, when $\Delta^2+\Omega^2 \leq (p/p_{th}-1)\gamma_{ab}^2$, (e.g. $P/P_{th}=2$) $\psi(\Delta)$ is negative from $\Delta=0.1.2$ and $\Delta<-1.2$. This means that the AC Stark splitting results in two areas almost symmetric about $\Delta$ with substantially equal negative dispersion. This permits bands formed near these peaks to compensate a static (positive) dispersion caused by waveguides and coatings so that the total intracavity dispersion is close to zero over these two areas. Furthermore, as the $P/P_{th}=2$ curve shows minima near $\Delta=\pm 1.2$ there is a neighbourhood around these points in which a difference between a relatively constant, fixed dispersion will be equally compensated at two points. These two neighbourhoods are nearly symmetric about $\Delta=0$ axis. Remarkably, there is overlap between both the two neighbourhoods and the two bands illustrated in FIG. 3, and thus two-color mode-locking lasers could be generated from the AC Stark splitting. More remarkable is that over a substantial range of separations of the bands, (i.e. for a range of $P/P_{th}$) the overlap between the neighbourhood and the bands is maintained. So not only does peak division by AC Stark splitting result in, for a judicious selection of cavity parameters, dual band mode locking; but it also provides for variable separation (tunable) dual band mode locking.

It should further be noted that a desired dispersion once computed having regard to the material and waveguide dispersions, and/or the coating dispersions by intracavity dispersion compensation. Alternatively or additionally, the coating can be chosen with the additional constraint to provide a desired fixed cavity dispersion.

It will be appreciated by those of skill in the art that a relatively high current may be required in order to produce AC Stark splitting, and that there are several drawbacks to operation at high current pumping levels, including the requirement for thermal control over the PIN diode laser. It is also possible to use the dynamic dispersion at lower pump powers to produce a similar effect. For example, at $P/P_{th}=1.01$, a group phase distribution as shown in FIG. 4 is produced. By choosing design electives to produce a cavity fixed dispersion that produces substantially equal phases across various frequency regions, and possibly a substantially equal dispersion over two or more frequency regions, intraband mode locking and interband mode locking can be achieved, respectively. It may also be possible to provide a fixed dispersion that provides for dispersion compensation at different bands at different operational conditions, such as for different $P/P_{th}$ values.

Furthermore, the use of attenuation and/or multilayer designs to derive compound (multi-band) gain curves, can also be subject to AC Stark splitting. If the (compound) gain curve has sufficient amplitude, and the active media can support elevated pump currents, 2N-bands of could be realized as the AC Stark effect could result in two areas around each of N peaks of the gain curves with the required dispersion to compensate for the fixed cavity dispersion within each band.

The foregoing theory is believed to correctly describe the AC Stark effect and its operation in the present invention, and is included as an explanation of the experimental results below, which support the foregoing theory, however the theory is not intended to be limiting.

Experiment 1

AC Stark Splitting

Laser Diode Specification

Figure 5:
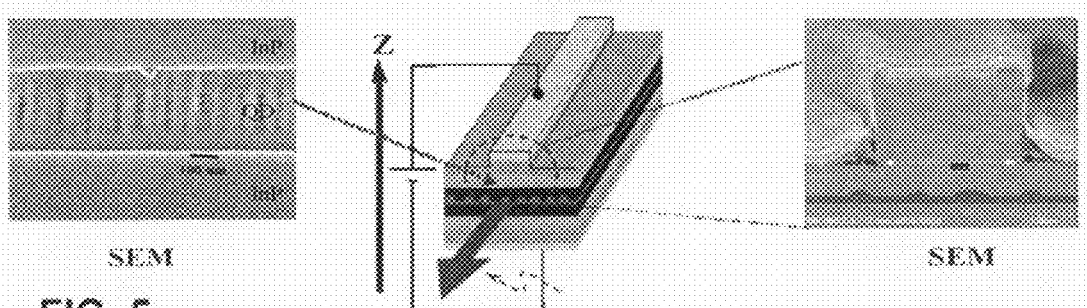
FIG. 5 schematically illustrates the structure of an embodiment of a laser diode in accordance with the invention, and shows two SEM images of active media as used therein.

FIG. 5 shows two SEM images of an active medium used to produce a laser diode, and a schematic illustration of such a diode, according to an embodiment of the invention. The rightmost image is a high magnification SEM image of a cross-section of the active medium showing 5 stacked QD layers. The leftmost image is at a lower magnification and shows the ridge waveguide structure in cross-section. An InAs/InGaAsP active medium with a self-assembled QD was grown by chemical beam epitaxy (CBE) on exactly oriented (100) InP n-type substrates, in a manner known in the art. The undoped active regions consisted of five stacked layers of self-assembled InAs QDs embedded in quaternary $In_{0.816}Ga_{0.392}As_{0.392}P_{0.608}$ (1.15 Q), providing three-dimensional electron confinement.

The QDs were formed by cracking substantially planar sheets having dimensions in the neighbourhood of $10^{-8}$ m in two dimensions on average, followed by resurfacing of the produced quantum dots so that they all have heights of a few nanometers in the third, From transmission electron microscopy (TEM) measurements, the QD density in each QD layer was computed. The approximate QD density was found to be $3\text{-}5\times 10^{10}$ per $cm^2$.

Optical confinement in the growth direction was achieved with a planar waveguide layered in between QD layers in the vertical direction to produce an active medium. $In_{0.816}Ga_{0.392}As_{0.392}P_{0.608}$ layers of 10 nm height in between the QD layers, and a thicker layer of the $In_{0.816}Ga_{0.392}As_{0.392}P_{0.608}$ was deposited above and below.

The active medium was clad in an n-type doped InP bottom layer and a p-type doped InP top layer. The top cladding was covered with a cap of $p^+$-$In_{0.522}Ga_{0.478}As$ to ensure good ohmic contact to the top metal stack. The active medium itself served as the optical pumping/lasing medium, a filter for longitudinal modes, a polarization maintaining component, and cavity mirrors as well. Accordingly it will be appreciated that changing properties of the QD layers, and/or the waveguide layers in which the QDs are embedded, will largely change the properties of the laser diode.

The multi-band multiwavelength mode-locking lasers produced has a ridge-waveguide Fabry-Pérot (F-P) cavity structure, which was cleaved perpendicularly to the diode junction plane, at a length of $L=456$ μm. The area of the active medium is 1,824 μ$m^2$.

Figure 6A:
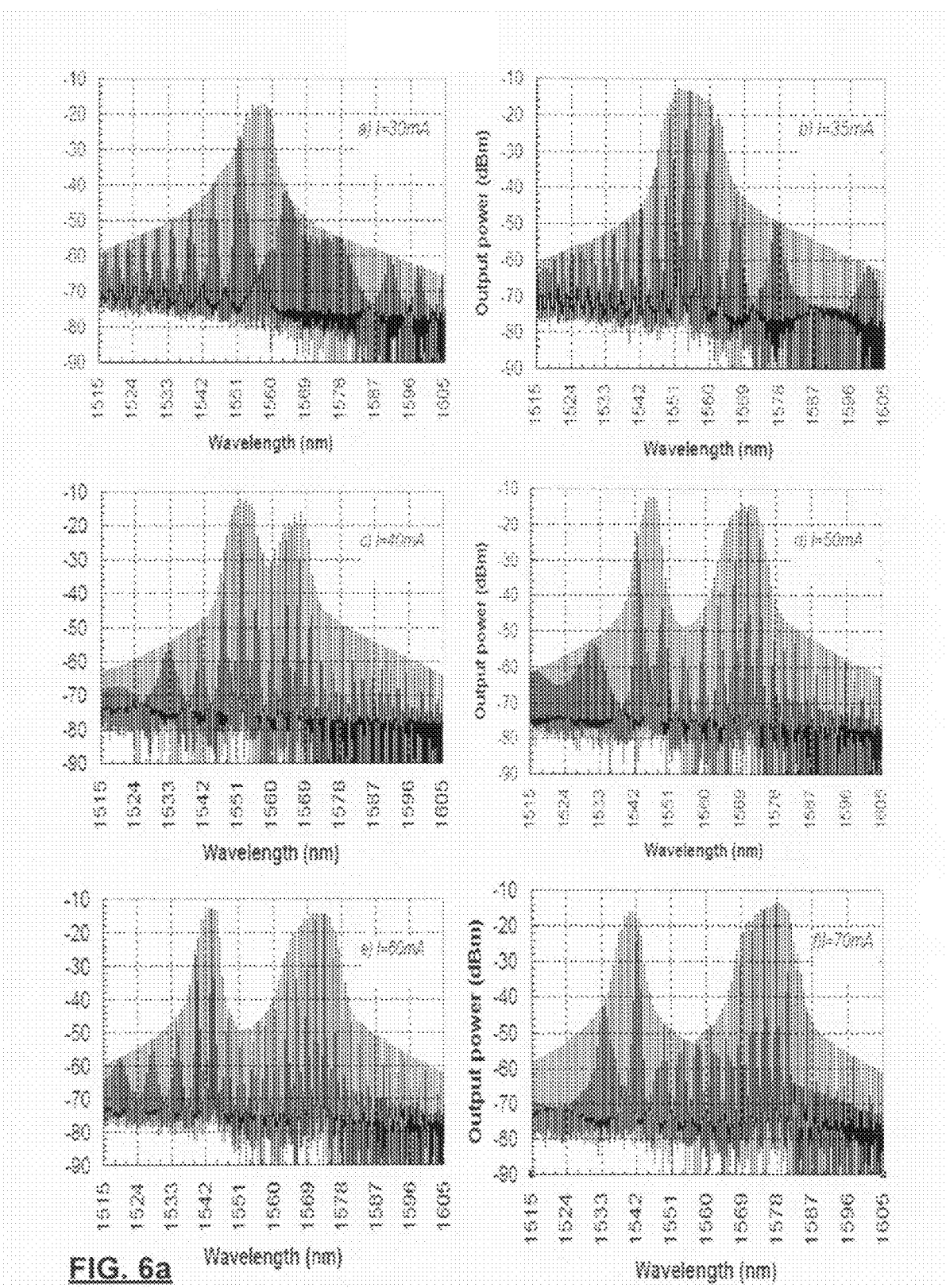
FIG. 6a shows the experimental lasing emission spectra taken under pump currents of 30 mA, 35 mA, 40 mA, 50 mA, 60 mA, and 70 mA, respectively
Figure 6B:
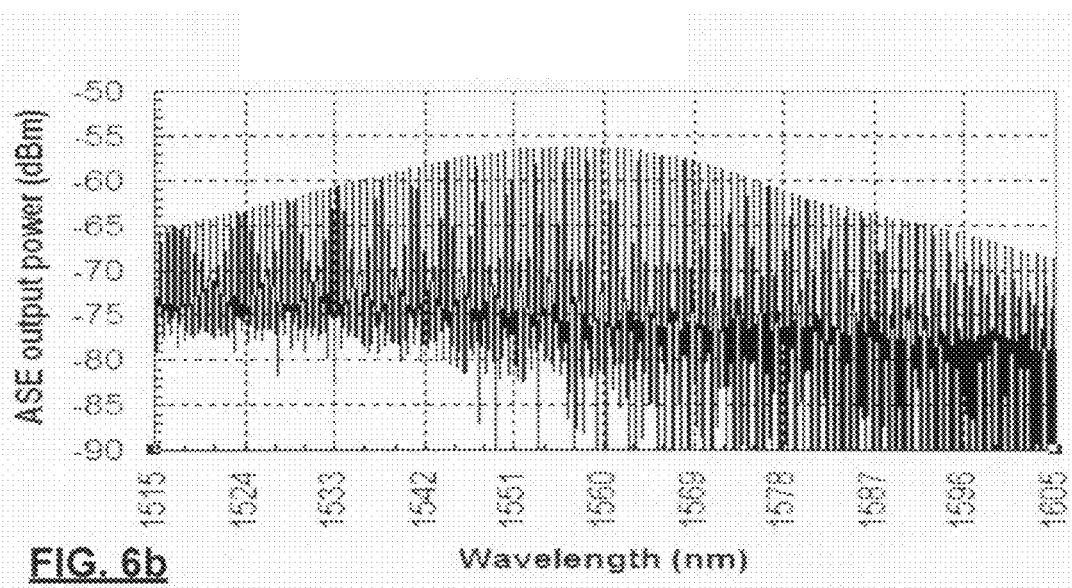

FIG. 6b is the measured ASE spectrum of the specific cavity cut to this size, before the addition of the output coupler. This curve shows a very broad, high power ASE response. Cavities with comparable ASE spectra are particularly well suited to the invention. The optical absorption in the frequency range of delta 5 to −5 is relatively constant, varying from 8-20 db/cm. The effective index of refraction in this neighbourhood is about 3.4-3.6. A static dispersion of this cavity (prior to facet coating) is deduced (from details reported in [38] the contents of which are incorporated by reference) to be about −5.1*10^(−4)/nm, which means that when wavelength increases 1 nm, the group refractive index decreases 0.00051.

Subsequently, one of the laser end facets was coated to produce 95% reflection for wavelengths within 1500 nm-1600 nm, and the other served as the output coupler, having about 30% reflectance. The both facets had flat spectral response in the wavelength region of lasing. The claddings of doped InP provide desired cavity interfaces that effectively select longitudinal modes within the cavity.

Measurement Apparatus

The laser output at one facet of the laser diode was coupled by a fiber with a numerical aperture of 0.35 and mode field diameter 4 μm, and sent to an optical spectrum analyzer (OSA) and a power meter (PM) through a SMF-28 fiber spliced with that fiber. The laser sample was mounted on a thermoelectric cooler (TEC) at room temperature, and driven by continuous pump currents. Various temperatures were experimented with and it was found that an optimal temperature, for a narrowest pulse duration, was about 18° C.

Laser Output

FIG. 6a shows 6 plots of experimental lasing emission spectra taken under pump currents of 30 mA, 35 mA, 40 mA, 50 mA, 60 mA, and 70 mA, as labeled. $P_{th}$ is about 17.2 mA. The pump voltage varied within about 2-4.5 volts. At each of these pump factors, a mode-locked spectral output of a single band, or dual band laser is produced. It is an advantage of the present invention that the same laser can be used for producing a single band that is mode locked, or multiple bands.

As the current increases, the output spectrum broadens. Two distinct bands can be resolved at a current of 40 mA and above. The higher the current applied across the active medium, the larger the wavelength separation between the two splitting bands caused by the AC Stark effect. In all cases the dual bands are intraband as well as interband mode locked.

At a pump current of 35 mA, a 11 channels having mode spacings of 745.2 pm was observed. The band was centered on 1554.3 nm, and had a bandwidth of (FWHM) 8.2 nm.

In contrast, at 60 mA, the laser had 15 modes, of which 10 modes were in a band from 1568 nm to 1576 nm (within the L-band), and 5 modes were in a distinct band from 1542 nm to 1546 nm (within the C-band). The 10 L-band modes had a slightly greater mode spacing at 763.0 pm, and the 5 C-band modes had a 732.4 pm mode spacing. The separation between two band center peaks at 60 mA was 28.0 nm, corresponding to a frequency difference of 3.462 THz, and the two bands were located almost symmetrically around 1557.7 nm, which coincides with the central lasing wavelength at a bias current of 30 mA.

The fact that the same laser can be made to produce a single band or pairs of bands of different separations by simply applying different currents is of considerable value.

Naturally every separation up to 28 nm can be achieved with a corresponding current between 30 and 60 mA, and greater separations (such as the 35 nm separation shown at 70 mA) are possible.

Mode Locking

To assess the temporal properties of the laser output, the above-identified diode laser setup (specifically the SMF-28 fiber) was coupled to a fiber-based background free $2^{nd}$ Harmonic generation autocorrelator made by Femtochrome Research Inc. (FR-103HS).

Figure 7:
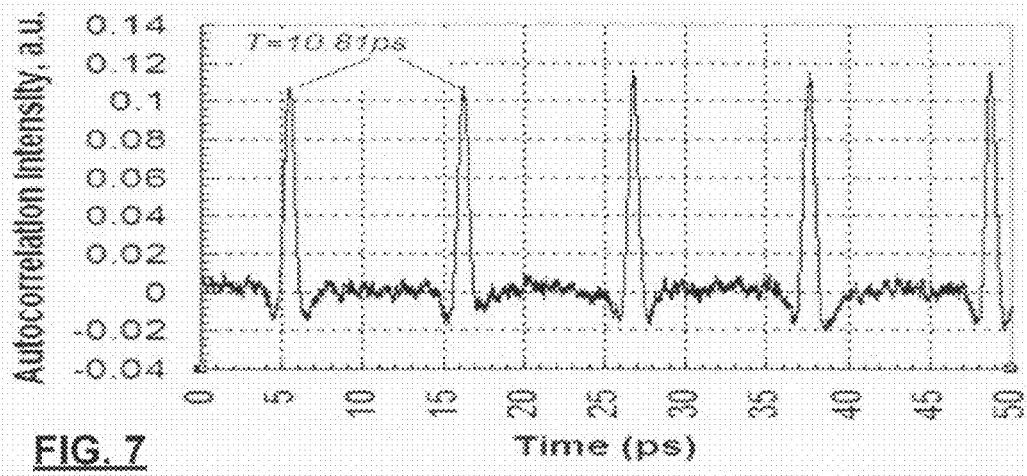
FIG. 7 is an autocorrelation plot of a pulse train obtained at 60 mA with a measured period of 10.81 ps.

FIG. 7 shows the emitted pulse train at a drive current of 60 mA from which the repetition rate was measured to be 92.5±1.25 GHz. It will be appreciated that the high regularity of the autocorrelated amplitude over time is a strong indicator that the laser is mode locked.

Furthermore, to confirm the interband mode-locking for both the C- and L-bands, the C-band modes were filtered using a homemade thin film bandpass filter.

Figure 8:
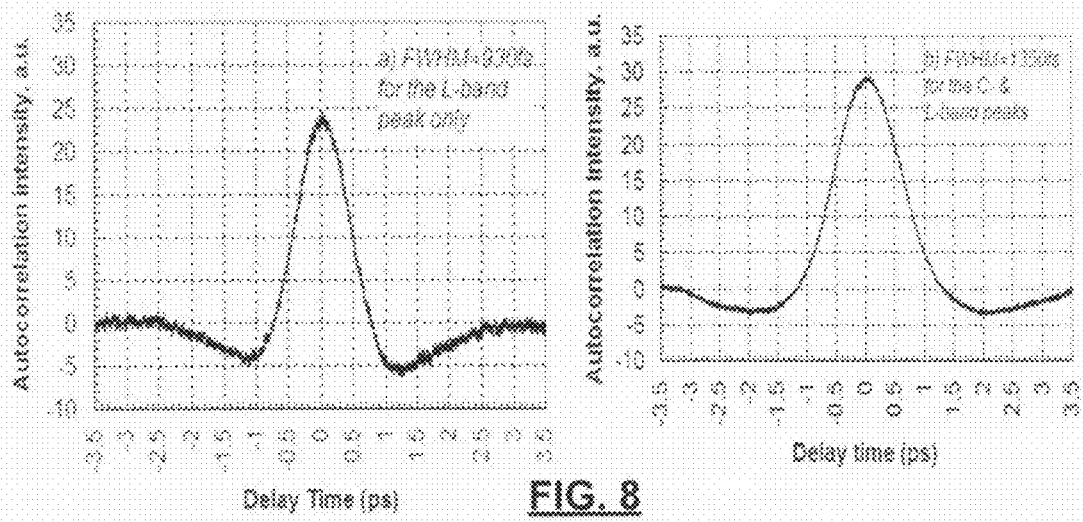
FIG. 8 shows two comparative autocorrelation traces showing the effect of excluding the C-band peak demonstrating that interband mode locking is produced.

In FIG. 8 (right panel) shows the autocorrelation intensity plot of the L-band alone (left panel). As this pulse exhibited the same repetition rate as the joint L- and C-band pulses, it is clear that interband mode locking was achieved. The pulse durations for the single L-band peak centered at $\lambda_1$ and the dual bands at $\lambda_1$ and $\lambda_c$, were 657 fs and 955 fs, respectively, assuming Gaussian temporal pulse profiles. From the self-correlation data and the cross-correlation data collected, the relative time jitter between the two-band pulse sequences was too small to be measured with the 10 fs-resolution autocorrelator used. The 45% increase in temporal bandwidth is explained by bandwidth differences in the two bands.

Example 2

Prophetic: Attenuation

Figure 9B:
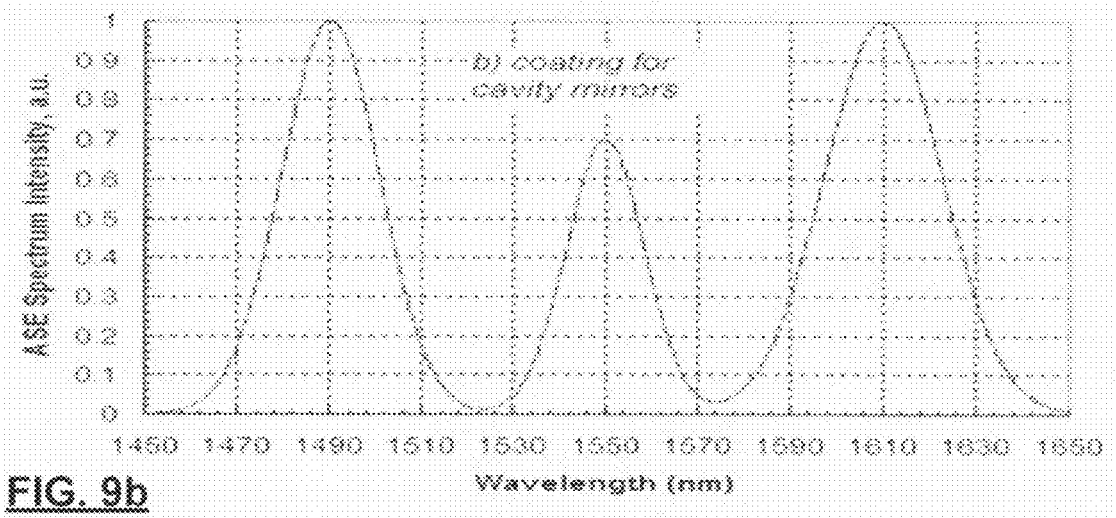
Figure 9C:
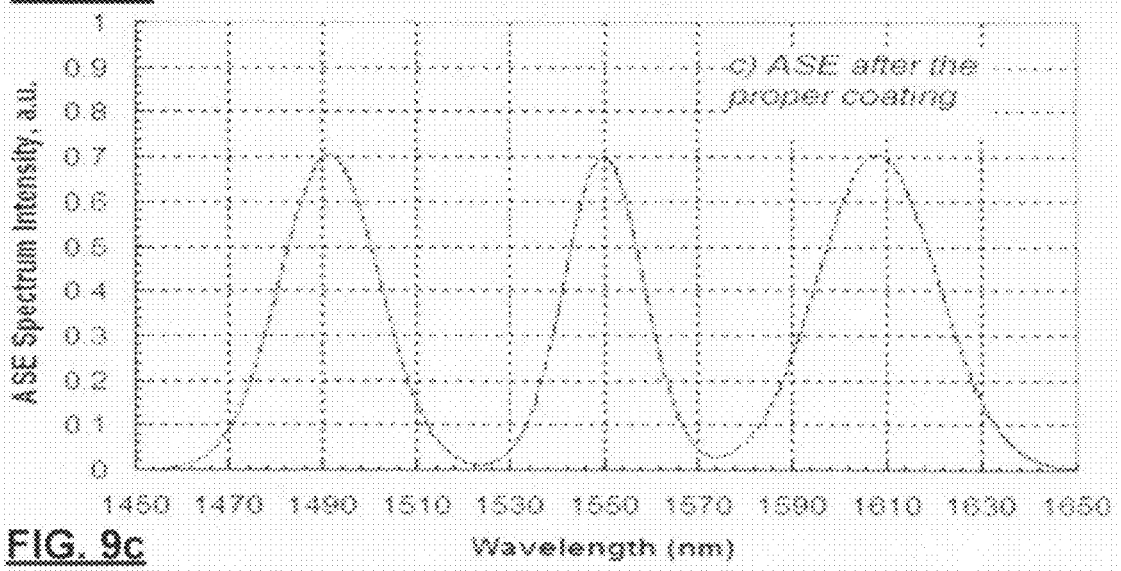

FIGS. 9a-c are graphs showing how attenuation at facets can be used to generate multi-band multiwavelength lasing. FIG. 9a is a graph of the obtained ASE spectrum of the cavity produced in relation to example 1, prior to addition of a facet. The multiwavelength channel structure is not presented as the resolution of the OSA was lower than the mode spacing. Only the band structure is manifest.

It is noted in FIG. 9a that the breadth of the uncoated ASE spectrum is great, with a FWHM of 170 nm. It is known in the art to provide cavity interfaces that selectively transmit modes as a function of frequency. Shown in FIG. 9b is a desired relative reflection spectrum designed to effectively remove modes having wavelengths of 1510-1535 nm and 1565-1585 nm from the cavity, as well as to reduce the amplitude of a center peak near 1550 nm to somewhat flatten the peak of the uncoated ASE spectrum. It is known in the art how to produce coatings to this specification.

The band structure of a resulting ASE spectrum expected for a cavity having facets exhibiting a relative reflection spectrum according to FIG. 9b is shown in FIG. 9c. Once again the multiwavelength channel structure is not illustrated, just the band structure. Given the fact that the attenuation cavity losses (losses due to material and waveguide+the losses at the interface) over the bands near 1490, 1550, and 1610 are majorized by the ASE of FIG. 9b, there will be lasing in each of these bands.

By analogy with the single band multiwavelength mode locked lasing demonstrated with the example above, this resulting ASE spectrum is expected to exhibit interband mode-locking.

Other advantages that are inherent to the structure are obvious to one skilled in the art. The embodiments are described herein illustratively and are not meant to limit the scope of the invention as claimed. Variations of the foregoing embodiments will be evident to a person of ordinary skill and are intended by the inventor to be encompassed by the following claims.

REFERENCES

1. Z. G. Lu et al. "Ultra-broadband quantum-dot semiconductor amplifier and its applications" In Proc. of Opt. Fiber Comm. (OFC'2007), JThA33, Anaheim, Calif., USA, March 2007.
2. J. Liu et al. "Uniform 90-channel multiwavelength InAs/InGaAsP quantum dot laser" Electron. Lett., 43, 458-460 (2007).
3. J. Liu et al. "1.6-μm multiwavelength emission of an InAs/InGaAsP quantum dot laser" IEEE Photonics Technol. Lett., 20, 81-83 (2008).
4. A. Kovsh et al. "Quantum dot laser with 75 nm broad spectrum of emission" Opt. Lett., 32, 793-795 (2007).
5. Q. Mao et al. "Multiwavelength erbium-doped fiber lasers with active overlapping linear cavities" J. Lightwave Technol., vol. 21, pp. 160-169, January 2003.
6. X. P. Dong et al. "Multiwavelength erbium-doped fiber laser based on a high birefringence fiber loop mirror" Electron. Lett., vol. 36, pp. 1609-1610, 2000.
7. J. Sun et al. "Multiwavelength erbium-doped fiber lasers exploiting polarization hole burning" Optic. Communications, vol. 182, pp. 193-197, 2000.
8. S. Pradhan et al. "Multiwavelength distributed Bragg reflector fiber laser" Electronics Letters, vol. 42, (17), pp. 963-964, 2006.
9. G. Das et al. "L-band multiwavelength fiber laser using an elliptical fiber" IEEE Photon. Technol. Lett., vol. 14, pp. 606-608, May 2002.
10. Y. G. Han et al. "Multiwavelength Raman fiber-ring laser based on tunable cascaded long-period fiber gratings" IEEE Photon. Technol. Lett., vol. 15, pp. 383-385, March 2003.
11. J. Yang et al. "Multiwavelength tunable fiber ring laser based on sampled chirp fiber Bragg grating" IEEE Photon. Technol. Lett., vol. 16, pp. 1026-1028, April 2004.
12. P. C. Peng et al. "A tunable dual-wavelength erbium-doped fiber ring laser using a self-seeded Fabry-Perot laser diode" IEEE Photon. Technol. Lett., vol. 15, pp. 661-663, May 2003.
13. Z. G. Lu et al. "High-power multiwavelength $Er^{3+}$—$Yb^{3+}$ codoped double-cladding fiber ring laser" IEEE Photon., Technol. Lett., vol. 17, (9), pp. 1821-1823, 2005.
14. Z. G. Lu et al. "A widely tunable narrow-linewidth triple-wavelength erbium-doped fiber ring laser" IEEE Photon. Technol. Lett., vol. 17, (1), pp. 22-24, 2005.
15. H. Chen "Multiwavelength fiber ring lasing by use of a semiconductor optical amplifier" Opt. Lett., vol. 30, pp. 619-621, 2005.
16. Z. G. Lu et al. "Frequency comb generation by cascade cavity-enhanced four-wave mixing in a semiconductor optical amplifier" Microwave and Optical Technology Letters, 23, 3, pp. 134-137, 1999.
17. M. T. Hill et al. "Integrated two-state AWG-based multi-wavelength laser" IEEE Photonics Technol. Lett., vol. 17, pp. 956-958, 2005.
18. X. Dong et al. "Multiwavelength Raman laser with a continuously-tunable spacing" Optics Express, vol. 8, pp. 3288-3293, 2006.
19. Z. Lu et al. "Quantum-dot-based semiconductor waveguide devices" US Patent Application 11983-1, Invention disclosure (October 2007).
20. S. Arahira et al. "160-gb/s OTDM signal source with 3R function utilizing ultrafast mode-locked laser diodes and modified NOLM" IEEE Photonics Technol. Lett., 17, 992-994 (2005).
21. H. Htoon et al. "Interplay of Rabi oscillations and quantum interference in semiconductor quantum dots" Phys. Rev. Lett., 88, 087401(2002).
22. M. R. X. de Barros et al. "Two-color synchronousely mode-locked femtosecond Ti: sapphire laser" Opt. Lett., 18, 831-833 (1993).
23. J. Liu et al. "Fabrication and stitching of embedded multi-layer micro-gratings in fused silica glass by fs laser pulses" Applied Physics B: Lasers and Optics, vol. 86, No. 1, 151-154 (2007).
24. C. Gosset et al. "Subpicosecond pulse generation at 134 GHz and low radiofrequency spectral linewidth in quantum dash-based Fabry-Perot lasers emittings at 1.5 μm" Electron. Lett., 42, 91-92 (2006).
25. X. Huang et al. "Passive mode-locking in 1.3 mm two-section InAs quantum dot lasers" Appl. Phys. Lett., 78, 2825-2827 (2001).
26. M. Kuntz et al. "35 GHz mode-locking of 1.3 mm quantum dot lasers" Appl. Phys. Lett., 85, 843-845 (2004).
27. J. M. Evans et al. "Dual-wavelength self-mode-locked Ti: sapphire laser" Opt. Lett., 13, 1074-1076, (1993).
28. F. C. Turner et al. "Anti-Stokes enhancement of multifrequency Raman generation in a hollow fiber" Opt. Lett., 33, 405-407 (2008).
29. M. Katsuragawa et al. "Generation of a 10.6-THz ultra-high-repetition-rate train by synthesizing phase-coherent Raman sidebands" Optics Express, 13, 5628-5634 (2005).
30. G. Park et al. "Low-threshold oxide-confined 1.3-μm quantum dot laser" IEEE Photonics Technol. Lett., vol. 13, pp. 230-232, 2000.
31. H. Saito et al. "Low chirp observed in directly modulated quantum dot lasers" IEEE Photonics Technol. Lett. vol. 12, pp. 1298-1300, 2000.
32. G. Ortner et al. "External cavity InAs/InP quantum dot laser with a tuning range of 166 nm" Applied Phys. Lett., vol. 88, pp. 121119, 2006.
33. X. Huang et al. "Passive mode-locking in 1.3-μm two-section InAs quantum lasers" Applied Phys. Lett., vol. 19, pp. 2825-2827, 2001.
34. Y. I. Mazur et al. "Tailoring of high-temperature photoluminescence in InAs/GaAs bilayer quantum dot structures" Journal of Applied Physics, vol. 98, 053515 (2005).
35. P. J. Poole et al. "Using As/P exchange processes to modify InAs/InP quantum dots" Journal of Crystal Growth, vol. 257, 89-96 (2003).
36. F. X. Kartner et al. "Design and fabrication of double-chirped mirrors" Opt. Letts., vol. 22, No. 11, 831-833 (1997).
37. J. A. Dobrowolski et al. "Refinement of optical multilayer systems with different optimization procedures" Appl. Optics, vol. 29, No. 19, 2876-2893 (1990).
38. J. Liu, et al. "1.6-μm multiwavelength emission of an InAs/InGaAsP quantum dot laser," IEEE Photonics Technol. Lett., 20, 81-83 (2008).

The invention claimed is:
1. A quantum dot PIN diode laser comprising:
a p doped cladding and an n doped cladding at opposite faces of an active medium, the active medium consisting essentially of layers of a waveguide material between at least one layer of semiconductor quantum dots having an inhomogeneously broadened gain curve;
cavity interfaces including an output coupler where a laser output is emitted, for producing a cavity enclosing the active medium, the cavity having a given cavity loss function, a fixed dispersion, and an amplified spontaneous emission (ASE) spectrum; and an electrical power supply connected to the claddings for supplying pump current through the active medium, the current chosen to produce a dynamic group phase change so that within each of at least two wavelength regions where the cavity loss function is majorized by the ASE spectrum, an effective dispersion is substantially constant, whereby multi-band multiwavelength laser emission is produced by the laser diode through the output coupler and within each band the multiwavelength channels are mode locked.

2. The diode laser of claim 1 wherein the active medium consists of fewer than 10 layers of quantum dots formed from epitaxial growth, the fewer than 10 layers all having a same gain curve.

3. The diode laser of claim 1 wherein the active medium consists of fewer than 10 layers of quantum dots formed from epitaxial growth, the fewer than 10 layers including at least two kinds of layers, each kind having different gain curve peaks.

4. The diode laser of claim 3 wherein at least one of the gain curve peak wavelengths lies within one of the at least two wavelength regions.

5. The diode laser of claim 1 wherein one or more of the cavity interfaces preferentially reflect light in the wavelength regions.

6. The diode laser of claim 1 wherein the electrical power supply is adapted to supply current above an AC Stark splitting threshold, where splitting of energy levels in the quantum dots yields a laser output spectrum having a pair of bands substantially symmetrically disposed about a peak of the ASE spectrum when operated below the AC Stark splitting threshold.

7. The diode laser of claim 1 wherein the cavity interfaces and waveguide provide a non-linear frequency dependent dispersion.

8. The diode laser of claim 1 herein the electrical power supply is adapted to supply current through the active medium, to produce a dynamic group phase change so that within the at least two wavelength regions the effective dispersion is substantially constant, the dynamic group phase change $\psi$ being given by:

$$\psi = \arctan\left\{\frac{p}{p_{th}}\gamma_{ab}\Delta \bigg/ \left[\Delta^2 + \Omega^2 - \left(\frac{p}{p_{th}} - 1\right)\gamma_{ab}^2\right]\right\}$$

where, $P/P_{th}$ is a pump factor, $\gamma_{ab}$ is the dipole moment decay rate of the quantum dots, $\Delta$ is a detune frequency, and $\Omega^2$ is a lasing intensity.

9. The diode laser of claim 1 wherein:

the cladding is comprised essentially of InP, the semiconductor quantum dots are comprised essentially of InAs, and the waveguide layers are comprised essentially of quaternary $In_{0.816}Ga_{0.392}As_{0.392}P_{0.608}$;

the semiconductor quantum dots have densities on the order of $10^{10}$ cm$^2$; and the cladding and active medium are arranged in a ridge-waveguide Fabry-Pérot cavity configuration having a cavity length in the neighbourhood of 0.5 mm, and a cavity width of 1-5 μm.

10. A method for providing a mode-locked multi-band multiwavelength laser output, the method comprising:

providing a pin diode laser having p and n doped claddings at opposite large faces of an active medium, the active medium consisting essentially of layers of a waveguide material between at least one layer of semiconductor quantum dots having a inhomogeneously broadened gain curve, and cavity interfaces, including an output coupler for controlling transmitted and reflected light, that produce a cavity encompassing the active medium, the cavity having a given cavity loss function, a fixed dispersion, and an Amplified Spontaneous Emission (ASE) spectrum; and supplying electrical pump current through the active medium via the claddings, the current chosen to produce a dynamic group phase change so that within each of the at least two wavelength regions where the cavity loss function is majorized by the ASE spectrum, an effective dispersion is substantially constant.

11. The method of claim 10 wherein providing a pin diode comprises providing the pin diode with the active medium having fewer than 10 layers of quantum dots formed by epitaxial growth, the fewer than 10 layers all having a same gain curve.

12. The method of claim 10 wherein providing a pin diode comprises providing the pin diode with the active medium having fewer than 10 layers of semiconductor quantum dots formed by epitaxial growth, the fewer than 10 layers including at least two kinds of layers, having different gain curve peaks.

13. The method of claim 12 wherein at least one of the gain curve peaks of the kinds of layers of the semiconductor quantum dots in the provided pin diode laser lies within one of the at least two wavelength regions.

14. The method of claim 10 wherein the cavity interfaces in the provided pin diode laser preferentially reflect light in the wavelength regions.

15. The method of claim 10 wherein supplying electrical current comprises applying a current above an AC Stark splitting threshold, where splitting of energy levels in the quantum dots yields a laser output having a pair of bands substantially symmetrically disposed about a peak of the ASE spectrum.

16. The method of claim 10 wherein the cavity interfaces in the provided pin diode laser and waveguide provide a non-linear frequency dependent dispersion.

17. The method of claim 10 wherein supplying electrical current comprises applying a current through the active medium to produce a dynamic group phase change so that within the at least two wavelength regions the effective dispersion is substantially constant, the dynamic group phase change $\psi$ being given by:

$$\psi = \arctan\left\{\frac{p}{p_{th}}\gamma_{ab}\Delta \bigg/ \left[\Delta^2 + \Omega^2 - \left(\frac{p}{p_{th}} - 1\right)\gamma_{ab}^2\right]\right\}$$

where, $P/P_{th}$ is a pump factor, $\gamma_{ab}$ is the dipole moment decay rate of the quantum dots, $\Delta$ is a detune frequency, and $\Omega^2$ is a lasing intensity.

* * * * *